United States Patent [19]

Walter

[11] Patent Number: 4,533,978

[45] Date of Patent: Aug. 6, 1985

[54] CIRCUIT BOARD STIFFENING

[75] Inventor: Leo Walter, Palos Verdes Estates, Calif.

[73] Assignee: Bucklee-Mears Company, St. Paul, Minn.

[21] Appl. No.: 499,209

[22] Filed: Jun. 6, 1983

[51] Int. Cl.³ .............................................. H05K 1/18
[52] U.S. Cl. .................................... 361/419; 52/765; 174/68 B; 174/68.5; 174/72 B; 292/253; 361/399; 411/359
[58] Field of Search .................. 174/68.5, 68 B, 72 B; 361/399, 407, 419; 52/764, 765, 768; 292/253; 411/359, 363, 524

[56] References Cited

U.S. PATENT DOCUMENTS

| | | | |
|---|---|---|---|
| 2,915,680 | 12/1959 | Kong | 174/68.5 X |
| 3,162,788 | 12/1964 | Allen et al. | 174/68.5 X |
| 3,491,267 | 1/1970 | Goshorn | 361/407 |
| 3,793,564 | 2/1974 | Salvati et al. | 174/68 B X |
| 4,159,506 | 6/1979 | Latasiewicz | 361/399 |
| 4,310,870 | 1/1982 | Kia et al. | 361/399 X |
| 4,420,653 | 12/1983 | Fukuda et al. | 174/72 B |

FOREIGN PATENT DOCUMENTS 1195829  7/1965  Fed. Rep. of Germany ... 361/399 X

Primary Examiner—R. R. Kucia
Attorney, Agent, or Firm—William W. Haefliger

[57] ABSTRACT

A circuit board stiffener includes an elongated stiffening member adapted to extend over the board surface in spaced relation to that surface; the member has contact surfaces adapted to engage one side of the board, and bendable retainer structure to retain the member in position relative to the board. The retainer structure may comprise bendable arms that project through board openings to be bent at the opposite side of the board, and to be locked in position by solder at that opposite side. The member may have a zig-zag cross section to enhance its stiffness.

7 Claims, 8 Drawing Figures

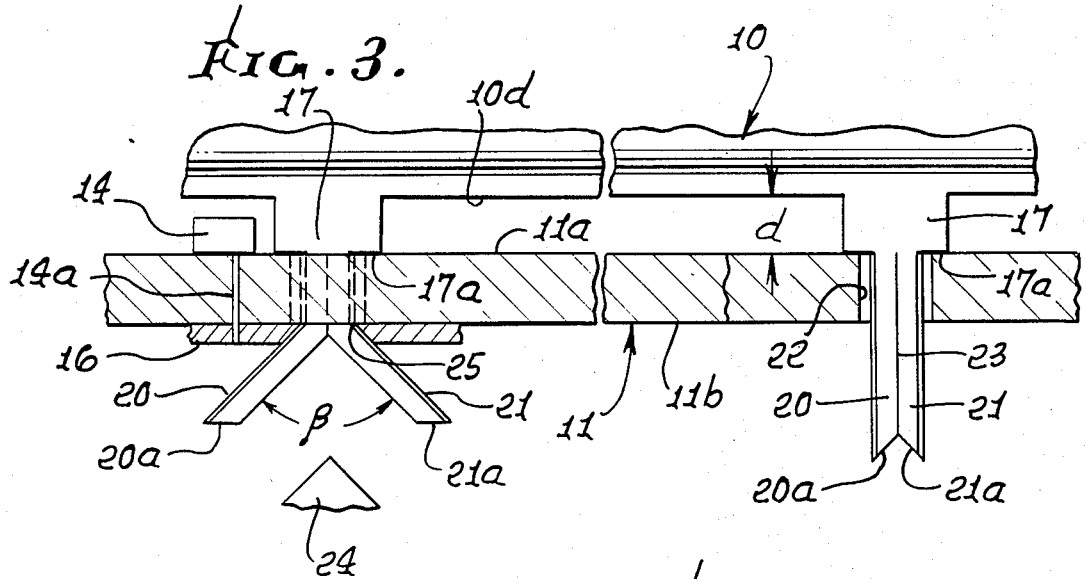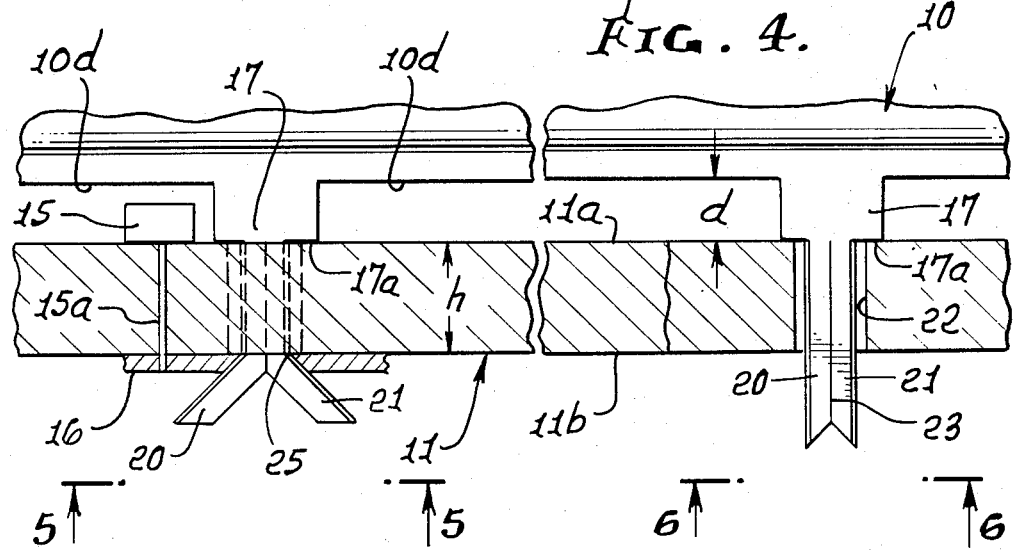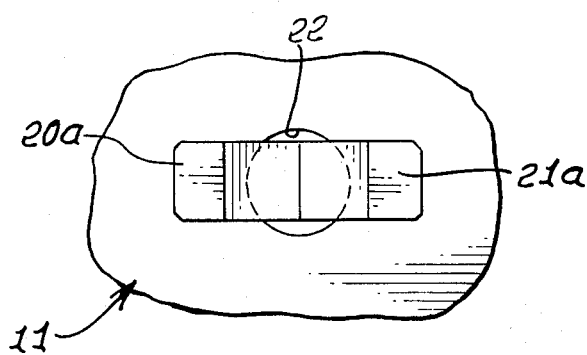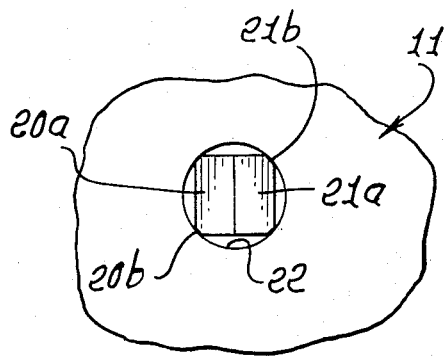

CIRCUIT BOARD STIFFENING

BACKGROUND OF THE INVENTION

This invention relates generally to the problem of preventing or reducing printed circuit board warpage or bending, and more particularly concerns the provision of unusually advantageous stiffener means applicable to a circuit board.

The problem of printed circuit board warpage or bending is commonly experienced, and can and does result in costly scrapping of many such boards after circuit elements have been connected in place. Scrapping is necessary because warped boards can be difficult or impossible to insert in pre-designed racks, and even if they are successfully inserted, they may bulge laterally to an extent that carried circuit elements come into catastrophic electrical contact with elements on closely spaced adjacent boards, ruining expensive electrical equipment.

SUMMARY OF THE INVENTION

It is major object of the invention to provide a simple and effective solution to the above problems and difficulties. Fundamentally, the invention is embodied in the elimination of circuit board warpage or bending, through provision of a board stiffener characterized by:

(a) an elongated stiffening member adapted to extend over the board surface and spaced therefrom, (b) contact surfaces integral with said member and adapted to downwardly engage the board, and (c) retainer means carried by said member to retain the member to the board.

As will appear, the retainer means is typically deformable to lock the stiffener to the board, and may comprise spreadable arms adapted to project through openings in the board, and operable when spread to engage the underside of the board and to pull the contact surfaces against the board to hold the member in position. Further, the stiffener may include projections forming the contact surfaces spaced from the main extent of the stiffener member, so that the latter is spaced from the board surface for better compatibility with the circuit elements located on the board.

In addition, the stiffener member may have irregular cross section construction to enhance its own bending stiffness, and the retainer arms may be spread so as to facilitate their locking to the board as via solder applied to the underside of the board.

It is a further object of the invention to provide method or methods for printed circuit board stiffening, as will appear.

These and other objects and advantages of the invention, as well as the details of an illustrative embodiment, will be more fully understood from the following description and drawings, in which:

DRAWING DESCRIPTION

FIG. 3 is a side elevation showing the FIG. 2 stiffener applied to a circuit board of relatively lesser thickness;

FIG. 4 is a side elevation showing the FIG. 2 stiffener applied to a circuit board of relatively greater thickness;

FIG. 5 is a bottom plan view taken on lines 5—5 of FIG. 4;

FIG. 6 is a bottom plan view taken on lines 6—6 of FIG. 4; and

DETAILED DESCRIPTION

Figure 1:
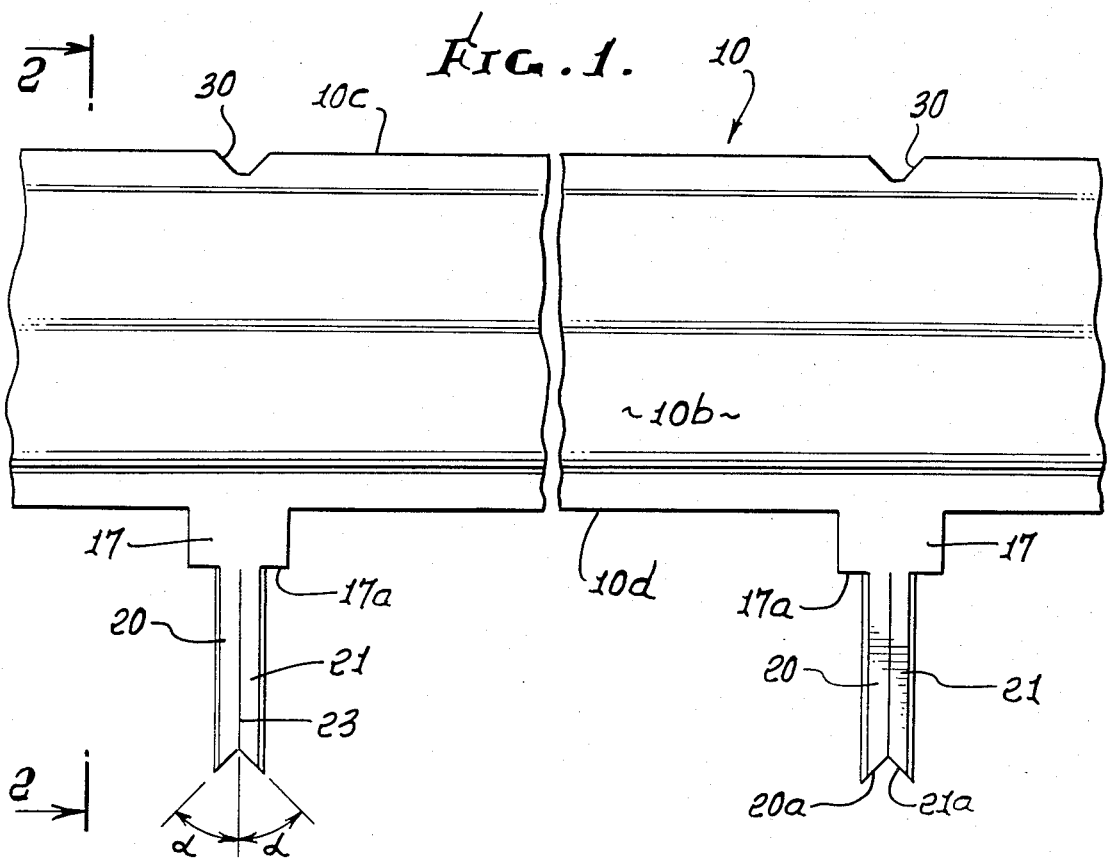
FIG. 1 is a side elevation showing a circuit board stiffener embodying the invention.
Figure 2:
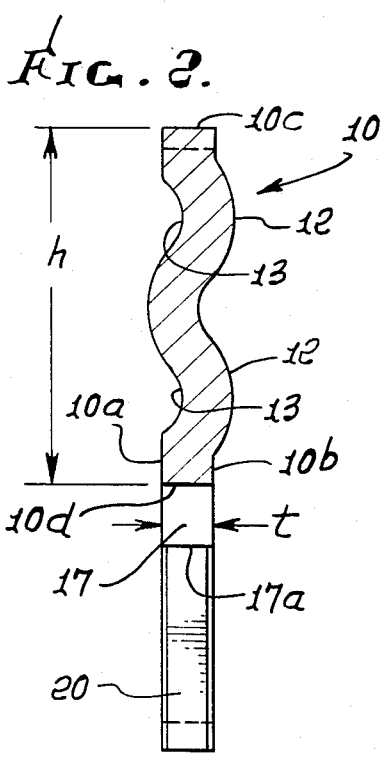
FIG. 2 is a section taken on lines 2—2 of FIG. 1.
Figure 7:
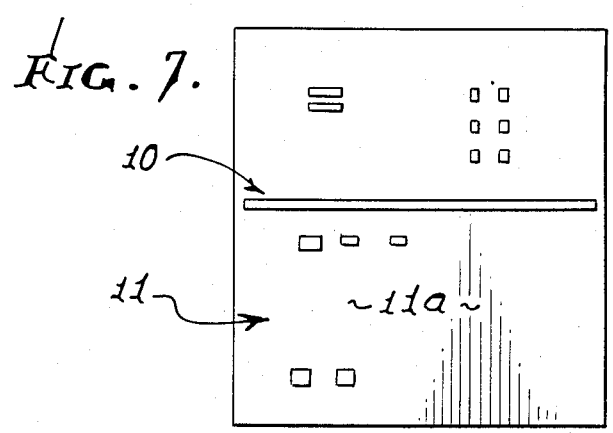
FIGS. 7 and 8 are plan views of circuit boards stiffened in accordance with the invention.
Figure 8:
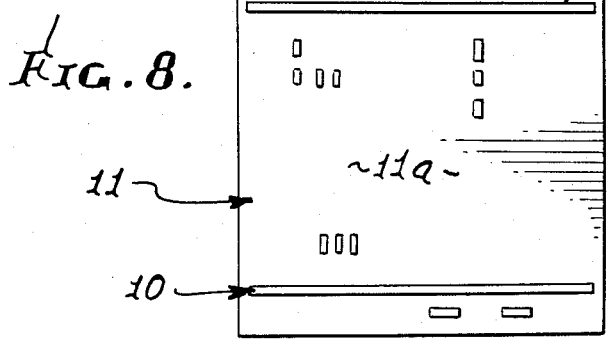

In FIGS. 1 and 2, the circuit board stiffener 10 is shown as lengthwise longitudinally horizontally elongated, so as to extend spanwise over the surface 11a of a circuit board 11 seen in FIG. 3, (as for example a printed circuit board). The stiffener is in the form of an elongated stiffening member or rib having opposite laterally facing sides 10a and 10b, a top surface 10c and a bottom surface 10d parallel to surface 10c. The stiffener typically has height dimension "h" between surfaces 10c and 10d several times greater than its thickness dimension "t" between surfaces 10a and 10b. Merely as illustrative, "h" may be about 0.300 inch, for example; and "t" may be about 0.040 inch, for example.

Also, the stiffener may have an irregular cross section in planes normal to the length dimension, as for example the plane of FIG. 2. As there shown, the cross section has zig-zag form, as defined between opposite sides 10a and 10b, the latter having merging convex and concave regions 12 and 13 respectively, as shown. Merely as illustrative, surfaces 12 may have radii of about 0.070 inches, and surfaces 13 radii of about 0.025 inches. Such irregularities enhance substantially the bending stiffness of the stiffener in a vertical longitudinal plane, to thereby resist circuit board warping or bending due for example to solder application, or circuit component application, or other causes. Consequently, the board will fit more readily, precisely and truly in or to preformed rack grooving, or other mounting structure. In this regard, the stiffener may consist of metal, such as brass, copper, stainless steel, or other stiff material.

The member 10 may extend between circuit components on the board, and/or may extend over such elements. See for example elements 14 and 15 located beneath the undersurface 10d of the member 10, in FIGS. 3 and 4. Such elements may typically have leads 14a and 15a passing through the board to make physical contact with solder 16 applied to the board surface 11b. The stiffener also includes contact surfaces integral with the member 10 and adapted to downwardly engage the board surface 11a. In FIGS. 1-4, the member has integral downward projections 17 forming contact surfaces 17a which locally engage the board surface 11a, whereby the main extent of the stiffener member 10 is upwardly spaced from surface 11a, as by dimension "d", and there is minimum or no obstruction with regard to board components such as at 14 and 15. In this regard, the stiffener may be applied to the board prior to application of such components, and solder 16, to the board.

Retainer means is also carried by the member 10 to retain the member to the circuit board, i.e. via the contact surfaces, as at 17a. Such retainer means may, with unusual advantage, be bendable take the form of spreadable arms 20 and 21 insertible downwardly through openings 22 in the board, and operable, when spread, to engage the underside of the board (or associated structure on the board) to engage the latter and exert force pulling the contact surfaces against the board top surfaces, thereby to hold the stiffener member in position which in turn holds the board against bending. Note arm corners 20b and 21b engaging the opening edge in FIG. 6.

As shown, the arms 20 and 21 are integral with and extend downwardly from the projections 17. The arms are in side-by-side relation, at separation plane 23, and have lower terminals 20a and 21a which are angled at $\alpha$ from vertical so that a $2\alpha$ angle is formed by the terminals. The angle $\alpha$ may with unusual advantage, be about 45°, so that the arms are readily spreadable by a tool shown at 24 in FIG. 3. The like spreading of the arms to form an angle $\beta$ therebetween also is shown in FIG. 3, and $\beta$ may be about 90°. Such spreading exerts force on the underside of the board at corner points 25, so that contact surfaces 17a are forcibly held down flatly on the board upper surface. Solder application to the underside of the board (as by wave soldering, for example) locks the spread arms in position, to lock the stiffener to the circuit board.

The example in FIG. 4 is the same as in FIG. 3; however, the board thickness "h" is greater than the board thickness in FIG. 3. The lengths of the arms accommodate such variations in board thickness, as is clear from FIGS. 3 and 4.

Finally, notches 30 in the top side 10c serve as visual locaters as they are in direct vertical alignment with the projections 17 and arms 20 and 21. Also, they serve receptors or locaters for tools to apply downward force onto the stiffener, to assure contact of surfaces 17a with the board as the arms are being spread.

The stiffener 10 also serves as a heat sink to dissipate heat generated by circuit elements and transmitted by radiation to the stiffener, or by conduction via the solder and spreadable arms. It may also serve as a bus bar, in certain applications.

I claim:
1. In a circuit board stiffener, the combination comprising
   (a) an elongated stiffening member adapted to extend over the board surface and spaced therefrom,
   (b) projections integral with said member and having surfaces adapted to engage one side of the board, and
   (c) bendable retainer means carried by said member to retain said member to one side of the board, said retainer means comprising pairs of arms, the arms of each pair extending in closely spaced, parallel, side-by-side relation so as to project from a position within an opening through the board and beyond the opposite side of the board to a position to be quickly spread apart and bent away from one another to engage said opposite side of the board or solder thereon and to pull the contact surfaces against said one side of the board to firmly hold said member in position,
   (d) said arms having terminals which are angled to receive and be spreadable by a spreading tool, and
   (e) there being a split between said arms, the split extending from said terminals into proximity to one of said projection surfaces.
2. The combination of claim 1 wherein said terminals have end surfaces that define a notch therebetween and which taper toward the end of said split.
3. The combination of claim 1 including said board engaged by said contact surfaces, said arms being located in position by solder on the board, the arms being generally polygonal in cross section and having elongated corners engaging walls extending about said openings in the board.
4. The combination of claim 1 including indicators on said member, in alignment with said arms.
5. The combination of one of claims 1, 2 and 3 wherein said member has an irregular cross-section in planes normal to the length dimension of said member.
6. The combination of one of claims 1, 2 and 3 wherein said member has a zig-zag cross-section in planes normal to the length dimension of said member.
7. The combination of any one of claims 1, 2 and 3 wherein the stiffener consists of metal.

* * * * *